Figure 1:
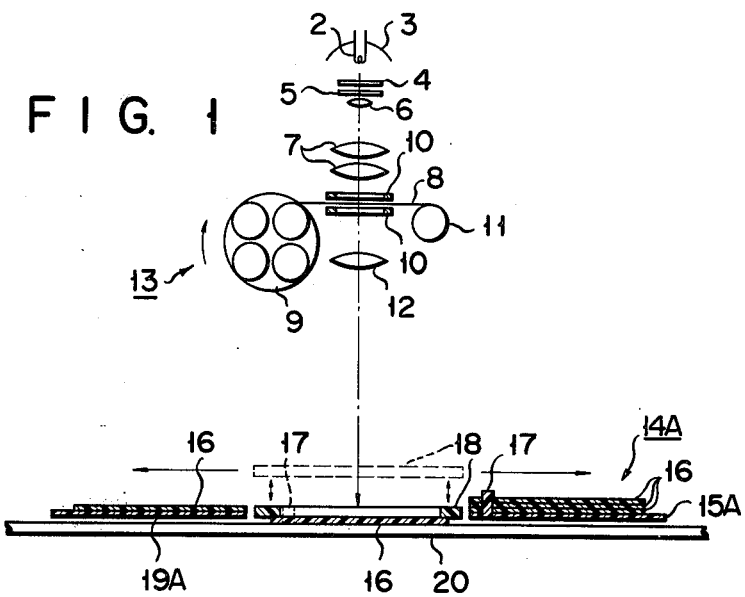

United States Patent [19]

Tabayashi

[11] 4,159,175
[45] Jun. 26, 1979

[54] METHOD FOR PRODUCING A PRINTING PLATE

[75] Inventor: Seiichi Tabayashi, Tokyo, Japan
[73] Assignee: Toppan Printing Co., Ltd., Tokyo, Japan
[21] Appl. No.: 877,972
[22] Filed: Feb. 15, 1978
[30] Foreign Application Priority Data Feb. 17, 1977 [JP] Japan .................................. 52-16466
Mar. 11, 1977 [JP] Japan .................................. 52-26737

[51] Int. Cl.² ...................... G03B 27/32; G03B 27/52
[52] U.S. Cl. ....................................... 355/77; 355/32; 355/40
[58] Field of Search ................. 355/71, 74, 77, 85, 355/89, 125, 132, 32, 40, 35

[56] References Cited

U.S. PATENT DOCUMENTS

| | | | |
|---|---|---|---|
| 1,808,743 | 6/1931 | Barkelew | 355/77 |
| 3,160,504 | 12/1964 | Montani | 355/71 X |
| 3,170,368 | 2/1965 | Barnhart | 355/32 |
| 3,288,024 | 11/1966 | Cronquist et al. | 355/71 X |
| 3,602,590 | 7/1969 | Lukens | 355/40 |
| 3,619,051 | 10/1969 | Wright | 355/32 |
| 3,857,635 | 12/1974 | Niehaus | 355/132 |
| 4,018,526 | 4/1977 | Schroter | 355/71 X |
| 4,043,663 | 8/1977 | Lein | 355/125 X |

FOREIGN PATENT DOCUMENTS 720704 11/1965 Canada ...................................... 355/40

OTHER PUBLICATIONS

Graphic Arts Monthly, Nov. 1974, pp. 72-76.
Graphic Arts Monthly, Feb. 1975, pp. 38-41.

Primary Examiner—Donald A. Griffin
Attorney, Agent, or Firm—Bacon & Thomas

[57] ABSTRACT

A method of making a printing plate from a negative microphotographic film by means of enlarged photographic projection which comprises the steps of impressing a code for detecting the respective frames of the negative microphotographic film on the blank space of said frames; automatically detecting any desired one of the frames by reference to the code; projecting the image of the detected frame on a transparent film of high dimensional stability at the same rate of enlargement as applied in photographically projecting said image on a printing plate material; preparing a retouching mask film by forming on said transparent film an additional pattern or reverse pattern by reference to the projected image; and applying the retouching mask film thus prepared in addition to the enlarged image of the negative microphotographic film impressed on the printing plate material.

4 Claims, 6 Drawing Figures

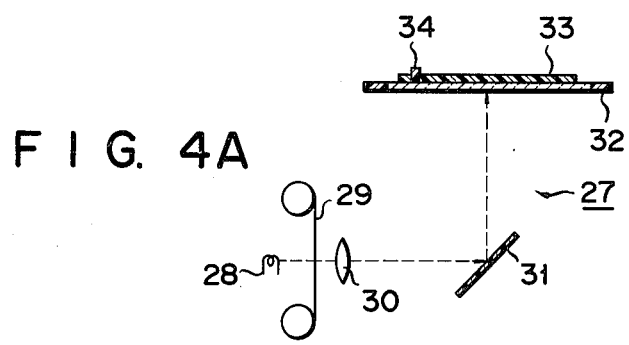
FIG. 4A
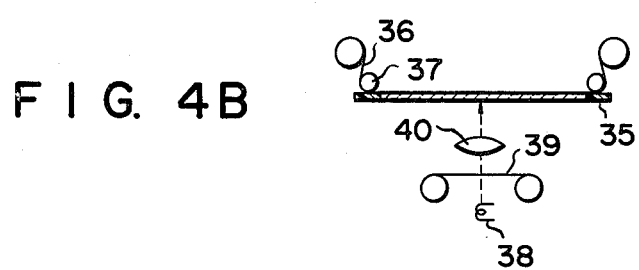
FIG. 4B
FIG. 5
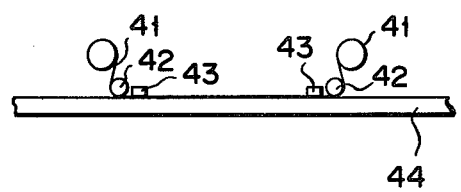

METHOD FOR PRODUCING A PRINTING PLATE

This invention relates to an enlarged projection method for making a printing plate from a midget negative microphotograph material such as a microfilm, and more particularly to a method for making a printing plate which comprises the steps of attaching specified codes to the respective frames of a negative microphotographic film obtained in the form of a roll or sheet to indicate their serial numbers; automatically detecting the codes in accordance with the previously arranged program; and photographically projecting the images of the respective frames on the designated sections of a printing plate set in a predetermined position, thereby finishing the printing plate. The invention further relates to a printing plate-manufacturing method which makes it possible to retouch or trim a negative microphotograph by means of a separately provided mask film. The customary method of making a printing plate is to prepare a negative photographic film as large as the finished dimensions and closely attaching the negative photographic film to a material of the printing plate being produced, followed by light exposure. Where a manuscript having a large number of pages such as a book is printed, photographs representing a certain number of pages of manuscript are grouped to constitute one film flat during the process of making a printing plate, requiring a great deal of manual work such as multiple exposure and patching up. Labor-saving means known to date includes a device designed to carry out repeat printing exposure with the respective film sheets exchanged one after another. However, such device, though of a large scale, consumes much time in conducting preparatory operations, for example, the setting of a negative photographic film, and can not always be considered efficient. Moreover, negative photographic films are generally obtained in the form of sheets of different sizes, presenting difficulties in handling and imposing restrictions on the manufacture of a printing plate by contact projection. Another known method of making a printing plate is to collect a large number of negative photographic films into a microfilm and project their images to make printing plates. The last mentioned method indeed has the advantages of eliminating the above-mentioned difficulties, easily reducing the work of making a printing plate, and decreasing the cost of raw material due to the possibility of using a small film. However, this method still has the drawbacks that difficulties arise in detecting required negative photographic film at the time of photographic projection and also in retouching defective negative photographic film and preparing a trimming mask because of the considerably small size of said photographic film.

It is accordingly the object of this invention to provide a printing plate-making method which, in view of the drawbacks accompanying the prior art, comprises the steps of photographing negative images in a microfilm, and projecting the image of the desired frame of said microfilm on a printing plate by automatic detection of said frame, and further makes it possible easily to carry out retouching and trimming during the production of a printing plate.

Figure 2:
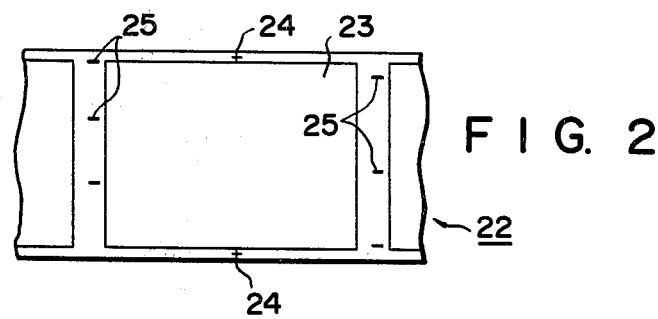
Figure 3:
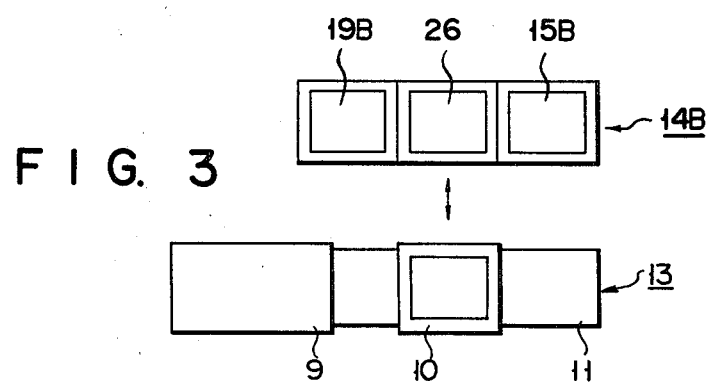

This invention can be more fully understood from the following detailed description when taken in conjunction with the accompanying drawings, in which:

FIG. 1 schematically shows the construction of a printing frame used with this invention;

FIG. 2 indicates the relative positions of a positioning code and detection code to one frame of a negative microphotographic film;

FIG. 3 illustrates the arrangement of the respective parts of a device for making a printing plate;

FIGS. 4(A) and 4(B) set forth the principle by which a mask film-preparing device produces a mask plate used with the invention; and FIG. 5 schematically presents the arrangement of another example of a mask film-preparing device used where a roll film is applied as a mask film.

There will now be detailed this invention by reference to the accompanying drawings. FIG. 1 schematically indicates the construction of a printing frame used with the invention. The printing frame 1 comprises a light source 2. reflector 3, heat ray absorbing filter 4, shutter 5. Collimator lens 6, condenser lens 17, cassette holder 9, film gate 10, take-up reel 11, projection lens 12, mask-collecting tray 15 and mask film-adsorbing frame 18.

Many of the ordinary printing plate materials have a relatively low sensitivity to light waves approaching ultraviolet rays. Therefore, it is necessary to apply a specially devised light source. The light source 2 of FIG. 1 is the type sending forth high illumination containing a large amount of ultraviolet rays to meet the above-mentioned object, and generally consists of an ultra high pressure mercury lamp. Light beams from the light source 2 are gathered by a rotary elliptic reflector 3 of high reflectivity, and collectively conducted to the collimator 6 through the heat ray-absorbing filter 4 and shutter 5. The collimator 6 has only its central portion fabricated in the form of a minute mat to scatter light beams for elimination of irregularities of illumination supplied from the light source 2. Since the peripheral portion of the collimator 6 is made flat, light beams pass without loss through said peripheral portion which might otherwise tend to be supplied with an insufficient quantity of light. In this case, light quantity slightly decreases only in the central portion of the collimator 6. Light beams conducted through the collimator 6 pass through the condenser lens 7 made of, for example, quartz prominently permeable to ultraviolet rays and then through the negative microphotographic film 8, and finally are focused in the position of the projection lens 12. A referential numeral 13 denotes a negative microphotographic film section which, as seen from FIG. 3, comprises a cassette holder 9, film gate 10 and take-up reel 11. The cassette holder 9 contains a plurality of cassettes, in each of which the negative microphotographic film 8 is received. A required cassette is selected, and a microphotographic film 8 received therein is conducted to the film gate 10. When brought to the film gate 10, the foremost frame of the negative microphotographic film 8 has to be identified by a detector (not shown) provided ahead of the film gate 10.

The most customary process of identifying the respective frames of a negative microphotographic film is to detect a detection mark given in the blank space of the frame. When a prescribed number of film frames are counted, the film is set in a specified position. This process is effective when the frames of a negative microphotographic film 8 are later exposed to light in the same order as that in which said film frames were originally negatively photographed. Where, however, the film frames were initially photographed in a different order from the above-mentioned case, or photographing were carried out over again, then it is necessary to rearrange the film frames or issue a different input instruction. Another known film frame identifying process is to impress a code on the blank space of a film frame to denote its serial number and later detect said code before the film frame is exposed to light. However, many of the conventional film frame identifying processes require a complicated identifying device. Moreover, where a desired frame has to be detected from among those arranged at random in a roll of film, the film roll has to be unrolled and made to travel for an appreciable distance with the possibility of the film surface being scarred and much time being consumed in detecting the desired film frame. To eliminate the above-mentioned drawbacks of the prior art film frame-detecting processes, this invention adopts a process of detecting a desired film frame from among a plurality of patterns constituting one unit, for example, one page of a book or from a group of film frames collectively representing one folding when each of the frames represents one page of a book end. One of the film frame-detecting processes adopted by this invention is to provide a plurality of cassettes for these different groups of patterns or frames, select a desired cassette from among those received in the cassette holder 9 and then search for a required frame in said selected cassette. FIG. 1 illustrates the above-mentioned film frame-detecting process of this invention. A plurality of cassettes are received in the cassette holder 9 rotated in the direction of an arrow indicated in FIG. 1. Selection is made of the cassettes upon receipt of an instruction from a computer. The cassette holder 9 is brought to rest at a prescribed position upon receipt of an instruction of a computer. The leading end of the negative microphotographic film 8 of the selected cassette is drawn out by means of a guide roller (not shown), and passes through the film gate 10 to be wound about the take-up reel 11. The negative microphotographic film 8 ceases to travel when a detection code 25 (FIG. 2) given in a blank space adjacent to a specified frame included in the negative microphotographic film 8 is read by a detector (not shown) disposed ahead of the film gate 10. While the negative microphotographic film 8 further slowly travels, the positioning code 24 of FIG. 2 is detected. After the position of the specified frame is defined crosswise as well as lengthwise in the plane in which the negative microphotographic film 8 travels, said negative microphotographic film 8 is brought to rest and securely set in place by being held in the film gate 10. The referential numeral 25 denotes a detection code corresponding the respective frames of the negative microphotographic film 8. Since, at this time, a primary detection is already finished by selecting a specified cassette from among those received in the cassette holder 9, the detection code 25 is used for the secondary detection of a desired frame from the negative microphotographic film 8 of the selected cassette. Where sixty-four frames are represented by means of, for example, the binary code system, then the detection code 25 is formed of six bars, six light detectors are set in the positions corresponding to said six bars. The serial number of each frame is determined from the manner in which the six light detectors are rendered conducting and nonconducting. One process of impressing the six detection code 25 in the blank space of the negative microphotographic film 8 is to provide six light-emitting diodes in the positions corresponding to the six detection code 25 on the outside of the frame of a camera for photographing the negative microphotographic film 8 and expose to light those portions of the negative microphotographic film 8 on which said detection code 25 are to be impressed, by causing said diodes to send forth a light. Where it is impossible to impress a detection code 25 at the time of light exposure, as in the ordinary case of using a microfilm itself as a negative, then it is advised for impression of said detection code 25 to provide a roll film with six code bar-shaped printing plates set in position; fix the position of a frame by the positioning code 24; and form the detection code 25 on the roll film by striking a colored ribbon with the printing plates occupying the specified positions as in the typewriter. Where the detection code 25 thus formed is cancelled, it is advised to smear away the code 25 in black or erase it and issue an instruction signal for preventing the detection of such painted-out code 25. Another process capable of detecting a desired frame is to use a roll of a negative microphotographic film without a cassette and designate a group of the frames of the negative microphotographic film and the serial numbers of the respective frames by two forms of code.

In the case of process work, a negative film prepared by a color scanner is applied intact. Or where one of specified photographic half-tone negative films kept in stock is repeatedly used, then a negative sheet film is applied in combination with a negative microphotographic film. In this case, it is advised to set the negative microphotographic film section 13 or cassette holder 9 in parallel with the later described sheet film device having the same arrangement as the mask film device 14A of FIG. 1 and, upon receipt of an instruction, align the negative microphotographic film section 13 or cassette holder 9 and said sheet film device 14B on the same optical axis indicated in a broken line in FIG. 1. FIG. 3 is a plan view of the negative sheet film device 14B set on the optical axis together with the negative microphotographic film section 13 or cassette holder 9. As seen from FIG. 1, the negative microphotographic film section 13 or cassette holder 9 and the negative sheet film device 14B are made to slide toward each other in the directions of the corresponding arrows to be set on the optical axis of the light source 1 with the accurate relative positions maintained. The negative sheet film device 14B has a similar arrangement to the mask film device 14A of FIG. 1, and comprises a negative sheet film collection tray 15B, exposing frame 26 and a negative sheet film collection tray 19B for holding negative sheet films already exposed to light. Where light exposure is carried out by operating the negative sheet film device 14B, the negative sheet film device 14B, instead of the negative microphotographic film device 13, is made to slide in the direction of the indicated arrow to be set on the optical axis of the light source 1. In this case, it is advised precisely to set the negative sheet film device 14B with an accurate relative position maintained to the negative microphotographic film section 13. A plurality of negative sheet films are mounted on the negative sheet film collection tray 15B in a prescribed position by means of a positioning punch-pin in the order in which they are exposed to light, with the negative film sheet being first exposed to light set uppermost. A frame resembling the mask film-adsorption frame 18 (FIG. 1) is transferred on to the negative sheet film collection tray 15B to adsorb the negative sheet films one by one. The adsorption frame is set on the optical axis, causing the images of said negative sheet films to be optically projected on a printing plate. Negative sheet films exposed to light are gathered on the exposed sheet film collection tray 19B. The above mentioned operation is repeated as often as required to complete the light exposure of the negative sheet films. During this time, the light source 1, negative microphotographic film section 13 and negative sheet film device 14B are made freely to travel over the material of a printing plate 20 to effect photographic projection thereon. In this case, arrangement is made for the film gate 10 of the negative microphotographic film device 13 and the light exposure frame 26 of the negative sheet film device 14B to be returned, if necessary, to the optical axis, thereby carrying out photographic projection on the printing plate material 20 from the negative microphotographic film 8 or negative sheet film.

Where multiprinting is undertaken on the printing plate material 20, it is generally necessary to reverse the top and bottom portions of an impression due to the necessity of paging. In this case, it is advised to rotate the negative microphotographic film section 13 through an angle of 180° or set the frames of the negative microphotographic film 8 upside down.

Another characteristic of this invention is that retouching of an image included in a negative microphotographic film can be easily undertaken during the production of a printing plate. Where a negative microphotographic film has to be partly erased or retouched after preparation, or where, in the case of, for example, a photographic film, it is necessary to trim an impression or adjust its shade, then the present invention has made it possible easily to conduct all these treatments during the preparation of a printing plate. With the customary printing plate-making practice, the above-mentioned object has been attained by retouching a negative microphotographic film by means of a strip film, manually rendering a required portion of the film opaque with a light-impervious material, trimming an impression by separately preparing a trimming mask, retouching an impression by applying a specially prepared retouching mask, or uptoning or reducing the shade of an impression by photographic means. Where, however, a negative photographic film is rendered into a microform, the above-mentioned operations mainly based on manual work are encountered with great difficulties and moreover have to be undertaken before a microphotograph is taken to prepare a copy. Therefore, once a negative microphotograph is made, retouching has to be carried out by taking the microphotograph of the copy over again. In the case of halftone printing, it is wasteful to carry out said retouching by unduly enlarging a copy being retouched, thus prominently decreasing the advantage of the microfilm system. This invention makes it possible easily to retouch the defective portions of an image of a negative microphotographic film when a printing plate is prepared by means of enlarged projection. According to the invention, said retouching is made by applying the mask sheet film-preparing device of FIG. 4 (A) and the mask film device 14A. A general referential numeral 27 given in FIG. 4 (A) denotes the principle by which the mask plate is prepared for the above-mentioned object. A light from a light source 28 is cast on a negative microphotographic film 29. The image of this negative microphotographic film 29 is projected in enlargement on a focusing glass plate 32 through a projection lens 30 and mirror 31. In this case, care should be taken to avoid the harmful effect of optical deformation by carrying out said projection at the same rate of enlargement as when projection is appplied on a printing plate material and using the same type of a lens system as the projection lens 12 (FIG. 1). A sheet film used as a mask film is set on the punch-pin 34.

Where a mask film is prepared from a roll film, then a device is applied which comprises, as shown in FIG. 4 (B), a light source 38, negative microphotographic film 39, projection lens 40, focusing glass plate 35, pressure roll 37 and roll film used as a mask film. Thus, a retouching mask film is formed such as a mask film having the later described additional pattern or reverse pattern or a trimming film. Where a mask film is prepared from a negative sheet film, it is more convenient for the saving of complicated work to design the positioning of the negative sheet film simply by setting it on the punch-pin.

There will now be described by reference to FIG. 4 the process of preparing a mask film. A transparent mask sheet film 33 of high dimensional stability such as a polyester base film is securely positioned by the punch-pin 34. In this case, the relative positions between the punch-pin 34 and the image of the mask film should be exactly the same as those between the positioning punch-pin 17 of FIG. 1 and the projected image of a negative microphotographic film. Where it is necessary to erase part of the image or to carry out the opaque trimming thereof, then it is advised to paint or paste in proper opaque material on that portion of an image which has to be deleted. Where it is necessary to prepare a retouching mask film having a pattern for an additional impression, then the sheet film used in the above-mentioned case is exchanged for another film base. In this case, a separately prepared negative film is pasted on that portion of the mask film on which an additional impression is to be made to render the non-image area of the mask film opaque. Or the image of a positive impression film pasted on a film base is transferred on another light-sensitive film in the negative form, thereby preparing a negative mask film. Where it is desired to correct by reduction or uptoning the shade of a given portion of the image of a negative microphotographic film, then that portion of a mask film sheet film 33 which corresponds to said given portion of the negative microphotographic film has its shade corrected by a dyestuff applied at a required concentration. The positive pattern of the mask film whose shade has thus been corrected by application of a dyestuff is transferred to a separate light-sensitive film to be converted into the negative form, thereby providing a negative mask film. Relationship between the extent to which the above-mentioned correction of the shade of the image of a negative microphotographic film should be carried out and the concentration at which a required dyestuff should be applied are experimentally detemined.

A plurality of mask film prepared to meet the above-mentioned various requirements are collected on the mask-collection tray 15 of FIG. 1 in the order in which they are exposed to light, by being securely positioned by the punch-pin 17 with the corrected surface kept below. The mask-collection tray 15 and mask film-adsorbing frame 18 are always made to travel jointly with the negative microphotographic film section 13 carrying a negative microphotographic film 8 and the light source section 1. The mask film-adsorbing frame 18 is designed to move vertically as well as horizontally and exactly regain its original position. The mask film-adsorbing frame 18 has a groove cut out all along the peripheral edge to adsorb the negative mask film by means of a vacuum pump. The central portion of said mask film-adsorbing frame 18 corresponding to the effective light exposure area of an image being projected on a printing plate material is formed of a flat plate of glass or plastics material prominently permeable to ultraviolet rays. The masking film-adsorbing frame 18 is moved on to the mask-collection tray 15 upon receipt of a signal representing a predetermined program securely to adsorb the mask films gathered on the mask-collection tray 15 one by one, bring the mask films back to their original position on the optical axis, tightly press them against a printing plate material 20, and expose them to a light. Where the image of the negative microphotographic film 8 is erased or trimmed or has its shade corrected by reduction, then it is advised to expose to a light the image projected from the negative microphotographic film 8 through the positive mask film. Then the required portion of the image is shut off from a light to attain the object of correction. The halftone dots of a projected image have their shade reduced due to the diffraction of a projected light and an insufficient light quantity around the halftone dots resulting from the fringe effect. The degree of said shade reduction varies with many factors such as the original condition of that portion of a negative film which is constituted by the halftone dots, the number of dot lines included in the image, rate of enlargement used in projection and properties of the light source system, lenses and printing plate material. Therefore, the desired degree of said shade reduction can only be determined experimentally in consideration of the above-mentioned factors. Further where additional impression or uptoning is required, the microphotographic film 8 is removed from the film gate 10, or the image-free portion of said microphotographic film 8 is brought to the film gate 10 after exposure has been made through said microphotographic film 8. A negative mask film is then set on the mask film-adsorbing frame 18, thereby attaining the object by double exposure.

Another process capable of attaining the same object is to apply a device shown in FIG. 5 instead of the mask-collection tray 15 and mask film-adsorbing frame 18 of FIG. 1. In this case, a mask film is formed by the device of FIG. 4(B). Referential numeral 36 denotes a transparent polyester mask film of high dimensional stability and 0.1 mm thick which is wound in the form of a roll having a prescribed width. The leading end portion of said roll film is pressed against the surface of the focusing glass plate 35 by a pressure roll 37. The other parts such as a light source 38, negative microphotographic film 39 and projection lens 40 have the same arrangement as those of FIG. 4 (A). The image of said negative microphotographic film 39 is projected on the focusing glass plate 35 at the same rate of enlargement as applied in the subsequent preparation of a printing plate. The succeeding operations are exactly the same as when a mask film is formed of the aforesaid sheet film. Retouching has only to be made on the mask roll film 36. Later, a detection code is attached outside the projected image of the respective frames of the negative microphotographic film. To this end, it is advised to indicate a code position by a making-off line at a prescribed point on the focusing glass plate 35 and impress a code on said point. FIG. 5 denotes a device corresponding to the mask film device 14 of FIG. 1. This device is mounted on a fixed printing plate material to be moved thereon jointly with the light source section 1 and negative microphotographic film section 13 with the same relative position as in FIG. 1 maintained thereto. The device of FIG. 5 comprises a retouched roll film 41 to be used as a mask film, pressure roll 42 and detection device 43. Where a computer issues an instruction for movement in accordance with the contents of the negative microphotographic film 8 of FIG. 1, then the retouched roll film begins to travel. When the detection device 43 detects a detection code, the roll film-feeding motor is brought to rest. The retouched roll film 41 is pressed against the printing plate material 44 by the pressure roll 42. The pressure roll 42 is kept apart from the printing plate material 44 while the retouched roll film 41 is travelling. When the roll film-feeding motor stops, the drop roll 42 is pressed against the printing plate material 44 by a spring. The detection device 43 comprises a light source and photoelectric detection tube. The light source is formed of a red or infrared ray which does not sensitize the printing plate material 44. Said nonsensitizing ray is reflected from the retouched roll film 41 and detected by the photoelectric detection tube. When a code impressed on a prescribed spot on the retouched roll film passes through said photoelectric detection tube, then said tube catches a detection signal which applies a brake to the roll film-feeding motor to stop the feeding of the roll film. It is advised to define the relative positions of the above-mentioned members when the retouched roll film 41 is prepared for use as a mask film. It is generally advised to define in advance the order in which the frames of the retouched roll film 41 are to be exposed to light for preparation of a mask film, and cause the roll film to be carried forward by one frame each time. Where difficulties arise in producing a mask film in the order in which the frames of the retouched roll film 41 are exposed to light, it is also possible to attach the same form of code as impressed on the respective frames of a negative microfilm to the frames of the retouched roll film 41 and detect a desired frame of the retouched roll film 41 upon receipt of an instruction from a computer. Where it is unnecessary to provide a mask film for a given frame of a negative microfilm, then it is advised to leave said frame in the form of a film base and attach only a code to said frame. Since that portion of the roll film 41 which is not retouched remains transparent, the above-mentioned procedure is convenient, because the same amount of light has only to be projected. In this case, a light is projected in the same manner as when a sheet film is used as a mask film. A film, whether of the roll or sheet form, used for preparation of a mask film can be applied repeatedly by removing a layer or light-impervious material pasted on the surface of the mask film after it has served the purpose. If the light sensitivity of a mask film material and the lumination of a light source are fully satisfactory, then it is possible to make a halftone dot impression directly on the printing plate by setting a contact screen in the mask film-adsorbing frame 18 of FIG. 1.

It is also possible to set a halftone dot negative film on the mask film-adsorbing frame 18 to be combined with the negative microphotographic film section 13, thereby exposing a desired image.

As mentioned above, this invention has the advantages that material is saved by rendering a negative photograph into the microform; a roll or sheet film of a prescribed size is automatically carried forward; any desired frame of the film is also automatically detected by attaching a particular code thereto; the images of the respective frames of the film are photographically projected on a printing plate material by setting the film at any desired spot on the printing plate material; the frequency of transferring material between numerous operation steps and the amount of manual work associated therewith are decreased; retouching or trimming which cannot be undertaken by the prior art process of preparing a printing plate from a microfilm has been made possible, thereby enabling the application of the invention to be extended to the printing of not only characters and line pictures but also halftone impressions; direct photographic projection of images can be effected from the same negative on a printing plate over a freely selected range by varying the rate of enlargement applied in said projection and changing the extent of trimming; many other impressions of the same pattern can be made from the same negative kept in stock; and it is possible to duplicate easy order printed matter such as a calendar, international publications, whose language alone to be changed, and other printed matter whose local compilation has been varied, or to which local personal elements have been added.

What is claimed is:

1. A method of producing a printing plate from a negative microphotographic film by means of enlarged photographic projection which comprises the steps of: (A) projecting an image of a frame of the negative microphotographic film which requires a retouching on a transparent film of high dimensional stability at the same rate of enlargement as applied in photographically projecting said image on a printing plate material and preparing a retouching mask film by forming on said transparent film a desired pattern by reference to the projected image; (B) automatically detecting any desired one of the frames by reference to a code preliminarily impressed on the blank space of said frames and projecting the image of the detected frame on a designated section of the printing plate; (C) automatically setting in place, interchangeably or simultaneously with the step (B), one of the retouching masks preliminarily prepared in the step (A) on the designated section of the printing plate and contact-printing the image of the retouching mask; (D) repeatedly applying a combined steps of (B) and (C) on other sections of the printing plate, thereby producing a printing of desired images on the printing plate while carrying out the required retouching.

2. The printing plate-producing method according to claim 1, wherein the retouching mask film is in the form of a roll or a sheet corresponding to the size of the printing plate and wherein a code is impressed on the retouching mask film for allowing a photoelectric detection of a desired frame.

3. The printing plate-producing method according to claim 1, wherein one of the retouching masks is automatically set in place, simultaneously with the step (B), on the printing plate and contact-printing of the image of the retouching mask is carried out by projecting the image of a prescribed frame of the negative microphotographic film which requires retouching on the retouching masks and the printing plate.

4. The printing plate-producing method according to claim 1, wherein one of the retouching masks is automatically set in place, interchangeably with the step (B) on the printing plate and contact-printing of the image of the retouching mask is carried out before or after projection of a prescribed frame of the negative microphotographic film which requires retouching.

* * * * *